United States Patent
Kim et al.

(10) Patent No.: US 7,224,750 B2
(45) Date of Patent: May 29, 2007

(54) APPARATUS AND METHOD FOR RECEIVING RF SIGNAL FREE OF 1/F NOISE IN RADIO COMMUNICATION SYSTEM

(75) Inventors: Jae-wan Kim, Yongin (KR); In-chul Hwang, Seoul (KR); Hae-moon Seo, Yongin (KR); Young-jin Kim, Yongin (KR)

(73) Assignee: Samsung Electronics, Co., Ltd., Suwon (KR)

( * ) Notice: Subject to any disclaimer, the term of this patent is extended or adjusted under 35 U.S.C. 154(b) by 748 days.

(21) Appl. No.: 10/461,264

(22) Filed: Jun. 13, 2003

(65) Prior Publication Data

US 2004/0057537 A1 Mar. 25, 2004

(30) Foreign Application Priority Data

Sep. 25, 2002 (KR) .................. 10-2002-0058119

(51) Int. Cl.
*H03K 9/00* (2006.01)
(52) U.S. Cl. ...................... 375/316; 375/350
(58) Field of Classification Search ............... 375/316, 375/317, 324, 328, 340, 346, 334, 350; 455/277.2
See application file for complete search history.

(56) References Cited

U.S. PATENT DOCUMENTS

| | | | | |
|---|---|---|---|---|
| 3,803,542 A * | 4/1974 | Longerich et al. | ............ | 367/94 |
| 4,736,390 A * | 4/1988 | Ward et al. | .................. | 375/316 |
| 4,783,852 A * | 11/1988 | Auracher | .................... | 398/203 |
| 5,887,247 A * | 3/1999 | Baltus et al. | ............ | 455/277.2 |
| 6,175,726 B1 * | 1/2001 | Sydon | ........................ | 455/209 |
| 6,600,911 B1 * | 7/2003 | Morishige et al. | .......... | 455/307 |
| 6,882,834 B1 * | 4/2005 | Balboni | ..................... | 455/255 |
| 6,941,121 B2 * | 9/2005 | Chen | ....................... | 455/232.1 |
| 2001/0022821 A1 * | 9/2001 | Ichihara | ..................... | 375/317 |
| 2005/0186927 A1 * | 8/2005 | Hayashi et al. | .......... | 455/232.1 |

* cited by examiner

*Primary Examiner*—Emmanuel Bayard
(74) *Attorney, Agent, or Firm*—F. Chau & Associates, LLC

(57) ABSTRACT

An apparatus and method for receiving RF signals in a RF communication system are provided. The apparatus for receiving RF signals comprises a pre-processing unit for bandpass-filtering a signal received through an external antenna with a predetermined bandwidth and extracting a RF input signal having a desired frequency; a mixing unit for mixing the RF input signal provided from the pre-processing unit with a local oscillation signal having the same frequency as the RF input signal and generating a desired baseband signal; a noise-free-signal amplifying unit for shifting the desired baseband signal to a band that is free of effects due to 1/f noise, amplifying the shifted baseband signal, and re-shifting the amplified signal to the baseband; and a baseband processing unit for selecting a desired channel signal from the amplified baseband signal to be provided from the noise-free-signal amplifying unit and amplifying the selected signal.

19 Claims, 5 Drawing Sheets

APPARATUS AND METHOD FOR RECEIVING RF SIGNAL FREE OF 1/F NOISE IN RADIO COMMUNICATION SYSTEM

BACKGROUND OF THE INVENTION

This application claims priority to Korean Patent Application No. 2002-58119, filed Sep. 25, 2002, in the Korean Intellectual Property Office.

1. Field of the Invention

The present invention relates generally to a radio communication system and, more particularly, to an apparatus and method for receiving radio frequency (RF) signals by which sensitivity degradation due to 1/f noise can be minimized.

2. Description of the Related Art

In order to satisfy continuous demands on multi-functional, high-performance radio frequency (RF) communication services and to facilitate highly integrated, smaller sized and more energy efficient communication systems, a direct conversion type receiver as shown in FIG. 1 has been widely used as a RF receiver in recent RF communication systems. The direct conversion receiver includes a pre-processing unit 10 for band-pass filtering an input RF signal received through an external antenna ANT, a mixer 20 for mixing the input RF signal with a local oscillation signal LO, and a baseband processing unit 30 for providing a baseband output.

In such a direct conversion receiver, an input RF signal is affected by noise having a frequency characteristic as shown in FIG. 2, e.g., 1/f noise, if the input RF signal is lowered to be within a baseband through the mixer 20. The direct conversion receiver is greatly affected by 1/f noise, which is inversely proportional to the frequency of a signal in the baseband. Particularly, in the case of implementing the direct conversion receiver with CMOS technology, a frequency roll-off as shown in FIG. 2 increases to an order of a few mega-hertz (MHz) and an effect due to 1/f noise becomes significant. Further, due to such 1/f noise, the sensitivity of the receiver is considerably degraded. Such sensitivity degradation of the receiver causes more serious problems in a narrow band system such as a GSM system and, therefore, conventional narrow-band direct-conversion receivers have not employed CMOS technology. Therefore, a need exists for utilizing CMOS technology to realize highly integrated, smaller sized and more energy efficient receivers in narrow band communication systems.

SUMMARY OF THE INVENTION

An apparatus and method for receiving RF signals without effects due to 1/f noise in a RF communication system are provided.

According to an aspect of the present invention, there is provided an apparatus for receiving RF signals in a RF communication system, which comprises a pre-processing unit for bandpass-filtering a signal received through an external antenna with a predetermined bandwidth so as to extract a RF input signal having a desired frequency; a mixer for mixing the RF input signal provided from the pre-processing unit with a local oscillation signal having the same frequency as the RF input signal and producing a desired baseband signal; a noise-free-signal amplifying unit for shifting the desired baseband signal to a band that is not affected by 1/f noise and amplifying the shifted baseband signal, and re-shifting the amplified signal to the baseband; and a baseband processing unit for selecting a desired channel signal from the amplified baseband signal to be provided from the noise-free-signal amplifying unit and amplifying the selected signal.

Furthermore, according to another aspect of the present invention, there is provided a method for receiving RF signals in a RF communication system, which comprises the steps of (a) bandpass-filtering a signal received through an external antenna with a predetermined bandwidth and extracting a RF input signal having a desired frequency; (b) mixing the RF input signal with a local oscillation signal having the same frequency as the RF input signal and producing a desired baseband signal; (c) shifting the desired baseband signal to a band that is not affected by 1/f noise and amplifying the shifted baseband signal, and re-shifting the amplified signal to the baseband; and (d) selecting a desired channel signal from the amplified baseband signal and amplifying the selected signal.

BRIEF DESCRIPTION OF THE DRAWINGS

The above aspects and advantages of the present invention will become more apparent by describing, in detail, preferred embodiments thereof with reference to the attached drawings in which.

DETAILED DESCRIPTION OF PREFERRED EMBODIMENTS

A preferred embodiment of an apparatus and method for receiving radio frequency (RF) signals in a RF communication system according to embodiments of the present invention will be described herein below.

Figure 3:
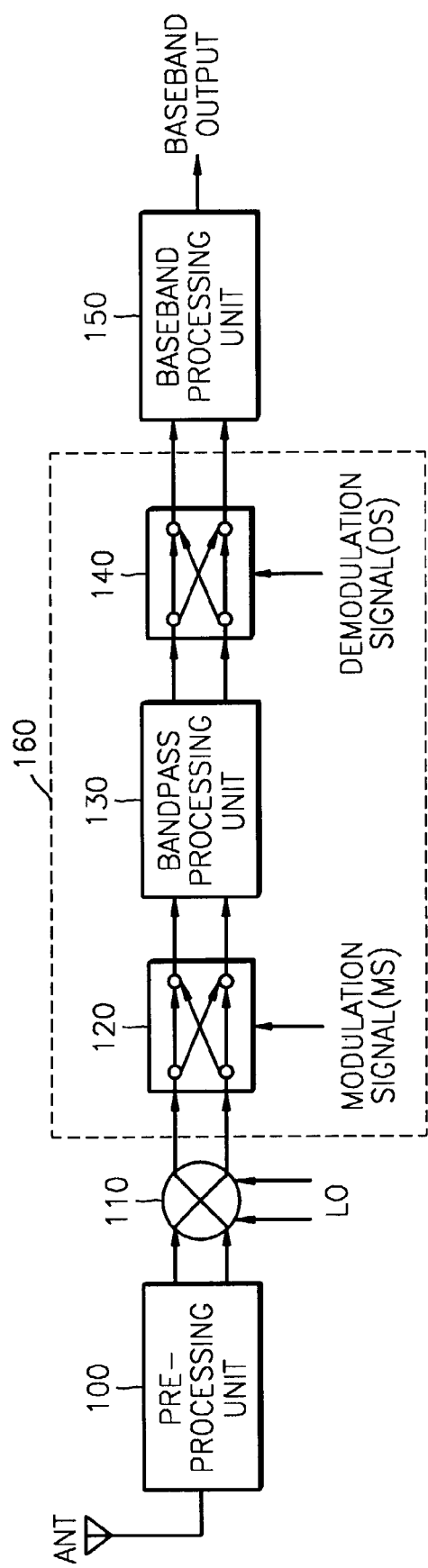
FIG. 3 is a schematic block diagram of an embodiment of a RF receiver according to the present invention.

FIG. 3 is a schematic block diagram of an embodiment of a RF receiver according to the present invention. Referring to FIG. 3, the RF receiver according to an embodiment of the present invention comprises a pre-processing unit 100, a mixer 110, a noise-free-signal amplifying unit 160, and a baseband processing unit 150.

The pre-processing unit 100 bandpass-filters a received RF signal with a predetermined bandwidth $f_{band}$ so as to extract a desired RF signal. Additionally, the pre-processing unit 100 amplifies and outputs the filtered RF signal as a RF input signal. Typically, the pre-processing unit 100 includes a RF switch, a pre-selection bandpass filter, and a low noise amplifier (LNA) (not shown).

Figure 1:
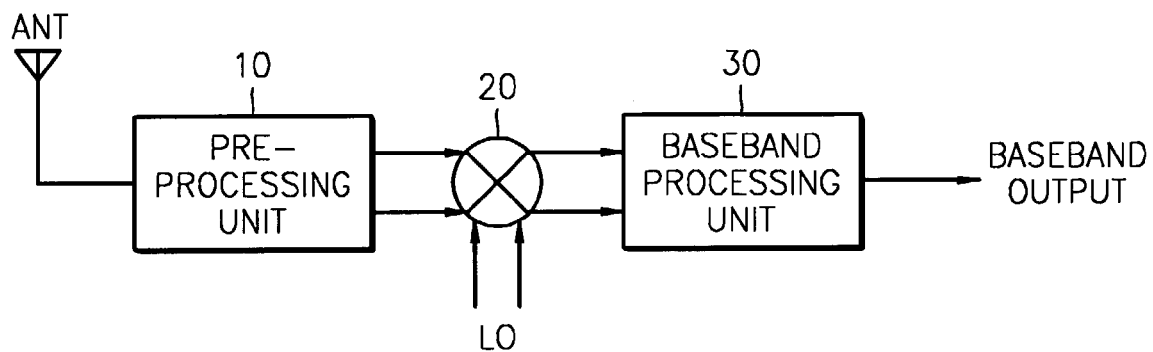
FIG. 1 is a schematic block diagram of a conventional direct conversion type radio frequency (RF) receiver.
Figure 2:
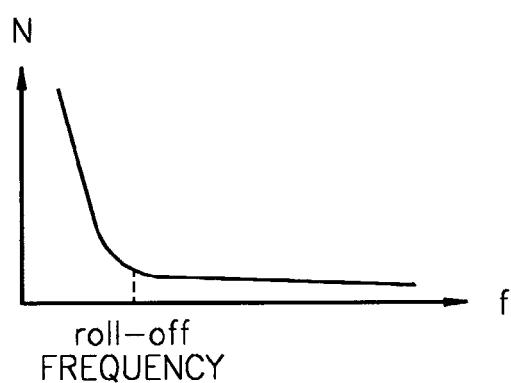
FIG. 2 shows a frequency characteristic of a semiconductor device.

The mixer 110 lowers a frequency of the RF input signal provided from the pre-processing unit 100 within a baseband by mixing the RF input signal with a local oscillation signal LO that has the same frequency $f_{LO}$ as the RF input signal, and produces a desired baseband signal. Since the mixer 110 has a frequency characteristic such as that shown in FIG. 2, the desired baseband signal is a signal having a very low signal-to-noise (S/N) ratio.

The noise-free-signal amplifying unit 160 shifts the desired baseband signal provided from the mixer 110 to a predetermined band that is not affected by 1/f noise and amplifies the shifted signal, and re-shifts the amplified signal to the baseband. Since the desired baseband signal is shifted to a band that is not affected by 1/f noise and, therefore, a signal free of 1/f noise is amplified, adverse effects such as sensitivity degradation due to 1/f noise can be avoided. Preferably, the noise-free-signal amplifying unit 160 comprises a chopper modulator 120, a bandpass processing unit 130, and a chopper demodulator 140.

The chopper modulator 120 modulates the desired baseband signal provided from the mixer 110 using a chopper modulation signal (MS) that has a chopper frequency $f_{chop}$, and shifts a band of the desired baseband signal to the chopper frequency $f_{chop}$ band. It should be noted that the chopper frequency $f_{chop}$ is higher than the highest frequency of the predetermined bandwidth $f_{band}$ for bandpass-filtering the received RF signal. Meanwhile, output signals from the chopper modulator 120 are spectrum-shifted by odd harmonics of the chopper frequency $f_{chop}$. Further descriptions on the chopper modulator 120 will be provided below with reference to FIG. 6.

The bandpass processing unit 130 bandpass-filters and amplifies only a signal having the chopper frequency $f_{chop}$ from the frequency spectrum of the odd harmonics generated by the chopper modulator 120. That is, the bandpass processing unit 130 amplifies the signal having the chopper frequency $f_{chop}$ in a frequency band that is not affected by 1/f noise so as to minimize sensitivity degradation due to 1/f noise. Meanwhile, as interferences in the RF receiver system, e.g., blockers, may saturate an amplifier included in the bandpass processing unit 130 prior to signal input to the bandpass processing unit 130, it is preferable to pass the signal output from the chopper modulator 120 through a passive type primary RC filter so as to attenuate such blockers. The primary RC filter may be simply formed using a load resistor of the mixer 110 and an external capacitor. Further, a conventional amplifier may be used as an amplifier of the bandpass processing unit 130 for amplifying the desired baseband signal that is shifted by the chopper frequency $f_{chop}$. Moreover, the bandpass processing unit 130 may include a tuned amplifier using an active inductor insofar as satisfying noise performance curves to reduce the effects of the blockers. In such a case, since DC offsets are lower than the blockers, the signal having the chopper frequency $f_{chop}$ is adequately amplified by the bandpass processing unit 130 without being saturated to the DC offset and, then, after the signal is demodulated to the baseband, the DC offset is removed using a conventional DC offset removing technique.

The chopper demodulator 140 re-shifts the signal amplified by the bandpass processing unit 130 to the baseband. At this instant, 1/f noise is shifted to the chopper frequency band. The chopper demodulator 140 outputs an amplified signal of the desired baseband signal free of 1/f noise.

The baseband processing unit 150 selects a desired channel from the baseband signal provided from the noise-free-signal amplifying unit 160, and amplifies the signal of the selected channel.

Since 1/f noise is shifted to the chopper frequency $f_{chop}$ band as described above, the effects due to 1/f noise can be avoided while baseband processing in the baseband processing unit 150. Therefore, the sensitivity degradation due to 1/f noise can be minimized in the baseband processing unit 150. Meanwhile, the baseband processing unit 150 typically comprises multi-stage architecture of a variation gap ampli- fier (VGA) and a filter. Although it is not shown in the attached drawings, a signal output from the baseband processing unit 150 is provided to a modem through an analog to digital converter (ADC) in a next stage.

Figure 4:
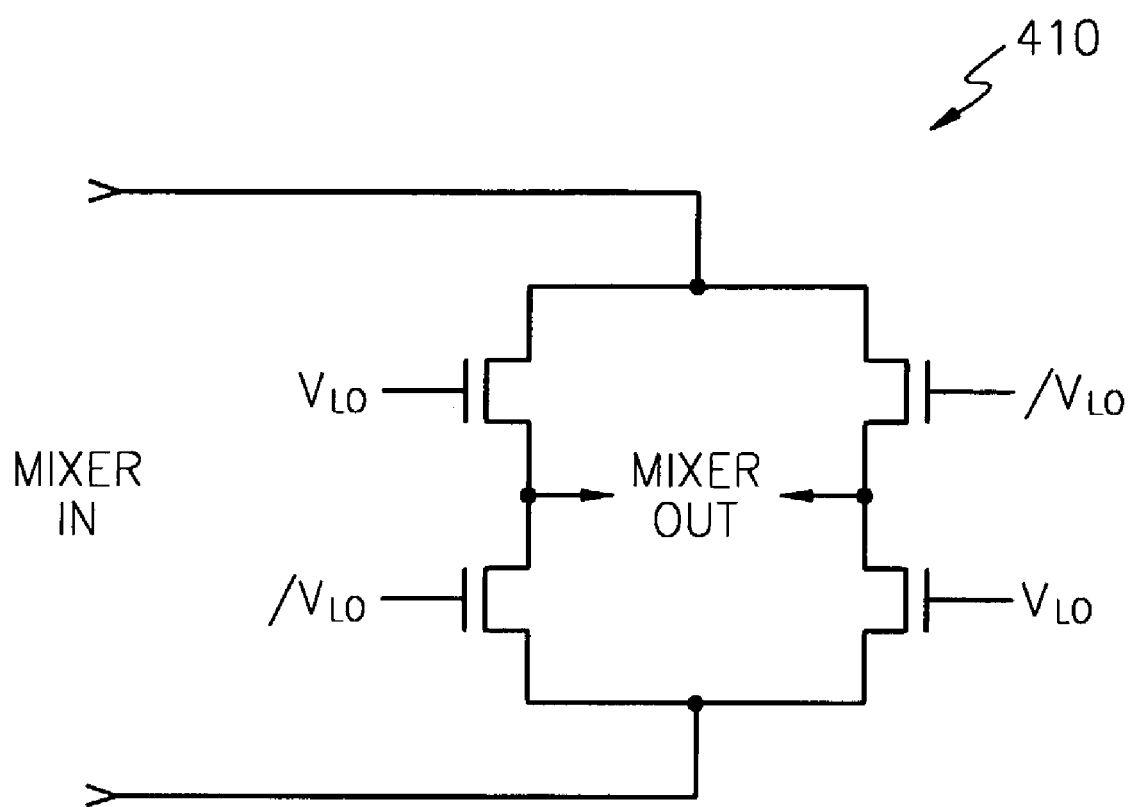
FIG. 4 is a circuit diagram of an embodiment of a mixer shown in FIG. 3.

It is noted that a typical CMOS active mixer cannot be used as the mixer 110 of the apparatus shown in FIG. 3, since the sensitivity of the apparatus for receiving RF signals can be degraded due to 1/f noise produced within the active mixer. Therefore, it is preferable that the mixer shown in FIG. 3 is a CMOS passive mixer 410 as shown in FIG. 4. The passive mixer 410 includes MOS switches and produces no gain. The signal to (1/f) noise ratio is to be kept high in such a way that the gain of the apparatus for receiving RF signals is shared by the pre-processing unit 100 or the bandpass processing unit 130.

FIGS. 5a through 5e show frequency spectrums of output signals of each unit shown in FIG. 3.

Figure 5:
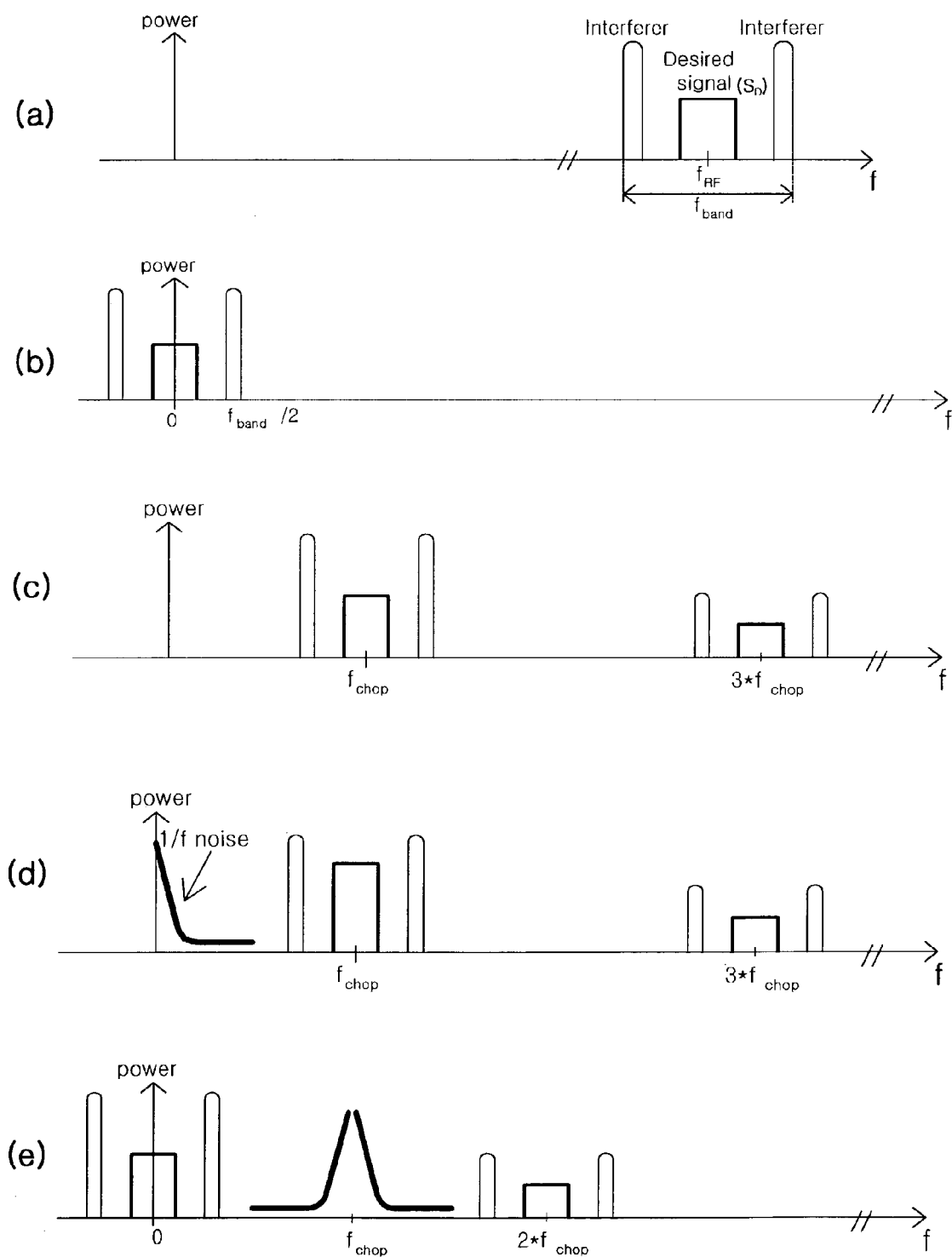
FIGS. 5a through 5e show frequency spectrums of output signals of each unit shown in FIG. 3.

FIG. 5a shows a frequency spectrum of a signal output from the pre-processing unit 100. The RF input signal $S_D$ received through the antenna ANT is band-limited within a predetermined bandwidth $f_{band}$ by the filter in the pre-processing unit 100.

FIG. 5b shows a frequency spectrum of a signal output from the mixer 110. The mixer 110 outputs a signal shifted to the baseband by mixing the band-limited RF signal with a local oscillation signal $f_{LO}$, which has the same frequency as the frequency $f_{RF}$ of the band-limited RF input signal. The shifted baseband signal has a zero intermediate frequency (IF) as shown in FIG. 5b.

FIG. 5c shows a frequency spectrum of an output signal provided from the chopper modulator 120. It is shown that the frequency spectrums of the baseband signal shifted to the zero IF by the mixer 110 are shifted to odd harmonics of the chopper frequency $f_{chop}$ by the chopper modulator 120.

FIG. 5d shows a frequency spectrum of an output signal provided from the bandpass processing unit 130. The bandpass processing unit 130 selects a signal that is band-shifted to the chopper frequency $f_{chop}$ from the frequency spectrum shifted to the odd harmonics of the chopper frequency $f_{chop}$, and amplifies the selected signal. As described above, since the frequency of a desired baseband signal is band-shifted to the chopper frequency $f_{chop}$, which is not affected by 1/f noise, it is possible to amplify the desired signal without effects of 1/f noise.

FIG. 5e shows a frequency spectrum of an output signal provided from the chopper demodulator 140. The signal amplified by the bandpass processing unit 130 is re-shifted to the baseband through the chopper demodulator 140. At this moment, 1/f noise is shifted to the chopper frequency $f_{chop}$ as shown in FIG. 5e. Since the desired signal is amplified without the effects of 1/f noise by the bandpass processing unit 130 and 1/f noise is shifted to the chopper frequency $f_{chop}$ by the chopper demodulator 140, the baseband processing unit 150 is also able to process signals without sensitivity degradation due to 1/f noise.

Figure 6:
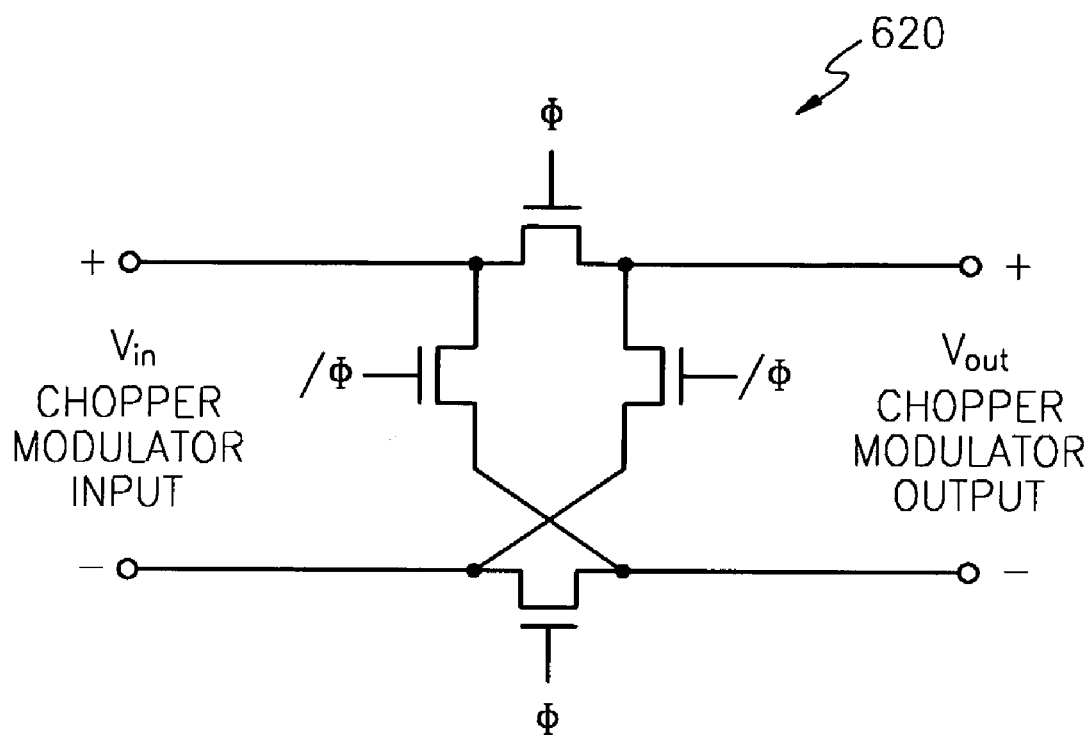
FIG. 6 is a circuit diagram of an embodiment of a chopper modulator shown in FIG. 3.

FIG. 6 is a circuit diagram of an embodiment of a chopper modulator 620 shown in FIG. 3. As shown in FIG. 6, the chopper modulator 620 can be made of four cross-coupled CMOS switches.

Figure 7:
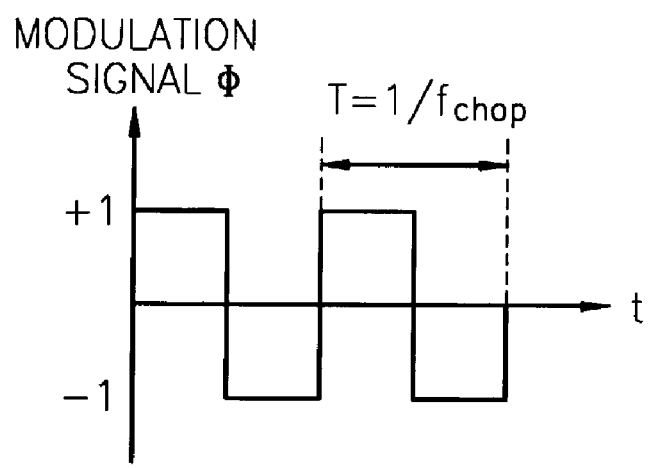
FIG. 7 shows waveforms of a modulation signal to be provided to the chopper modulator shown in FIG. 6.

FIG. 7 shows waveforms of a modulation signal to be provided to the chopper modulator 620 shown in FIG. 6. The modulation signal (MS) φ is a square wave having amplitudes of +1 and −1 as shown in FIG. 7. To prevent aliasing of an unwanted signal in a desired signal band, the chopper frequency $f_{chop}$ of the modulation signal φ should be above the predetermined bandwidth $f_{band}$ for bandpass filtering the RF signal received by the pre-processing unit 100.

Meanwhile, the chopper demodulator 140 may have the same configuration as the circuitry of the chopper modulator 620 shown in FIG. 6, where a demodulation signal is also the same as the signal shown in FIG. 7.

As described above, an apparatus and method for receiving RF signals according to embodiments of the present invention can selectively amplify a desired signal without effects due to 1/f noise by shifting the desired baseband signal to the chopper frequency band and, then, amplifying the shifted baseband signal using the chopper modulator 120 and re-shifting the amplified signal to the baseband using the chopper demodulator 140. Accordingly, sensitivity degradation of the RF receiver due to 1/f noise can be minimized. Further, since the effects of 1/f noise can be avoided, it is possible to implement the entire apparatus for receiving RF signals with a CMOS device. Therefore, it is possible to realize a highly integrated, smaller sized and more energy efficient RF receiver even in a narrow band system using CMOS technology in connection with a passive mixer.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. An apparatus for receiving radio frequency (RF) signals in a RF communication system comprising:
   a pre-processing unit for bandpass-filtering a signal received through an external antenna with a predetermined bandwidth and extracting a RF input signal having a desired frequency;
   a mixer for mixing the RF input signal provided from the pre-processing unit with a local oscillation signal having the same frequency as the RF input signal and outputting a desired baseband signal;
   a signal amplifying unit for shifting the frequency of the desired baseband signal to a predetermined frequency band, amplifying the frequency shifted baseband signal, and re-shifting the frequency of the amplified signal to the baseband frequency; and
   a baseband processing unit for selecting a desired channel signal from the amplified baseband signal to be provided from the signal amplifying unit and amplifying the selected channel signal.

2. The apparatus for receiving RF signals according to claim 1 wherein the pre-processing unit includes:
   a bandpass filter for extracting the RF input signal from the signal received through the external antenna, and
   a low noise amplifier for amplifying the extracted RF input signal.

3. The apparatus for receiving RF signals according to claim 1 wherein the mixer is a CMOS passive mixer having no gain.

4. The apparatus for receiving RF signals according to claim 1, wherein the signal amplifying unit includes:
   a chopper modulator for modulating the frequency of the desired baseband signal using a chopper modulation signal and shifting the frequency of the modulated baseband signal to a chopper frequency band that is a frequency of the chopper modulation signal;
   a bandpass processing unit for extracting only a signal of the chopper frequency band among a frequency spectrum of odd harmonics of the chopper frequency produced by the chopper modulator and amplifying the extracted signal; and
   a chopper demodulator for re-shifting the frequency of the signal amplified by the bandpass processing unit to the baseband frequency using a chopper demodulation signal having the chopper frequency.

5. The apparatus for receiving RF signals according to claim 4, wherein the chopper frequency is determined to be above the frequency of the predetermined bandwidth.

6. The apparatus for receiving RF signals according to claim 4, wherein the bandpass processing unit is a tuned amplifier using an active inductor.

7. The apparatus for receiving RE signals according t claim 4 farther comprising a passive filter for attenuating interference signals before inputting the signal produced from the chopper modulator to the bandpass processing unit.

8. The apparatus for receiving RE signals according to claim 4, wherein the chopper modulation signal and the chopper demodulation signal are square waves having amplitudes of ± n and the chopper frequency.

9. The apparatus for receiving RF signals according to claim 4 wherein the chopper modulator and the chopper demodulator are implemented using cross-coupled CMOS switches.

10. A method for receiving radio frequency (RF) signals in a RF communication system comprising the steps of: (a) bandpass-filtering a signal received through an external antenna to a predetermined bandwidth and extracting a RF input signal having a desired frequency; (b) mixing the RF input signal with a local oscillation signal having the same frequency as the RF input signal and generating a desired baseband signal; (c) shifting the frequency of the desired baseband signal to a predetermined frequency band, amplifying the shifted signal, and re-shifting the frequency of the amplified signal to the baseband frequency; and (d) selecting a desired channel signal from the amplified baseband signal and amplifying the selected channel signal.

11. The method for receiving RF signals according to claim 10, wherein said step (c) includes the steps of: (c1) modulating the desired baseband signal using a chopper modulation signal and shifting the frequency of the modulated baseband signal to a chopper frequency band that is a frequency of the chopper modulation signal; (c2) extracting only those signals of the chopper frequency from a frequency spectrum of odd harmonics of the chopper frequency produced in the step (c1) and amplifying the extracted signal; and (c3) re-shifting the frequency of the signal amplified in the step (c2) to the baseband using a chopper demodulation signal having the chopper frequency.

12. The method for receiving RF signals according to claim 11, wherein the chopper frequency is determined to be above the frequency of the predetermined bandwidth.

13. The method for receiving RF signals according to claim 11, further comprising the step of filtering attenuating interference signals included in the signal produced in the step (c1).

14. The method for receiving RE signals according to claim 11, wherein the chopper modulation signal and the chopper demodulation signal are square waves having amplitudes of ± n and the chopper frequency.

15. An apparatus for receiving radio frequency (RF) signals in a RF communication system comprising: a pre-processing unit for extracting a RF input signal from a signal received from an external antenna and outputting a desired baseband signal; means for shifting the frequency of the desired baseband signal at a desired frequency to a frequency having less noise and outputting the shifted baseband signal; means for amplifying the shifted baseband signal; means for re-shifting the frequency of the amplified shifted baseband signal back to the desired frequency; and a baseband processing unit for outputting the amplified baseband signal.

16. The apparatus for receiving RF signals according to claim 15, wherein the pre-processing unit comprises a bandpass filter for filtering the RF input signal from the signal received through the external antenna with a predetermined bandwidth and a mixer for mixing the RF input signal with a local oscillation signal having the same frequency as the RF input signal and outputting the desired baseband signal.

17. The apparatus for receiving RF signals according to clam 15, wherein the baseband processing unit selects a desired channel from the amplified baseband signal and amplifies the selected channel signal.

18. The apparatus for receiving RF signals according it claim 16, wherein the frequency having less noise is determined to be above a highest frequency of the predetermined bandwidth.

19. The apparatus for receiving RF signals according, to claim 15, further comprising means for filtering attenuating interference signals included in the shifted baseband signal outputted from the shifting means.

* * * * *